United States Patent [19]

Davis

[11] Patent Number: 5,331,296
[45] Date of Patent: Jul. 19, 1994

[54] OSCILLATOR HAVING CONTROLLABLE FREQUENCY COMPENSATION FOR SUPPRESSING UNDESIRED FREQUENCY OF OSCILLATION

[75] Inventor: Timothy D. Davis, Arlington, Tex.

[73] Assignee: National Semiconductor Corporation, Santa Clara, Calif.

[21] Appl. No.: 961,751

[22] Filed: Oct. 16, 1992

[51] Int. Cl.$^5$ .......................... H03B 5/32; H03L 3/00
[52] U.S. Cl. ..................... 331/158; 331/160; 331/175; 331/183
[58] Field of Search ............ 331/105, 116 R, 116 FE, 331/158, 109, 160, 175, 182, 183

[56] References Cited

U.S. PATENT DOCUMENTS

| | | | |
|---|---|---|---|
| 4,321,562 | 3/1982 | Igarashi | 331/116 FE |
| 5,050,085 | 9/1991 | Wright | 331/158 X |
| 5,101,178 | 3/1992 | Komoda | 331/175 X |

Primary Examiner—Siegfried H. Grimm
Attorney, Agent, or Firm—Skjerven, Morrill, MacPherson, Franklin & Friel

[57] ABSTRACT

A low-power crystal oscillator circuit is disclosed that includes an amplifier section having a switchable compensation network. In one embodiment, the oscillator circuit incorporates inverter amplifiers to generate a square-wave output signal that can be used, for example, as a clock signal to drive microprocessors and other digital circuitry. The invention takes advantage of the observation that, if the uncompensated bandwidth is not too excessive, compensation is only needed at start-up to ensure oscillation at the desired crystal frequency. Once the desired oscillation is attained, most of the oscillation cycle occurs during the non-linear regions of the amplifier. These non-linear regions are characterized by low gain, thus suppressing any spurious oscillation. The compensation network is removed after start-up to reduce power consumption.

28 Claims, 4 Drawing Sheets

OSCILLATOR HAVING CONTROLLABLE FREQUENCY COMPENSATION FOR SUPPRESSING UNDESIRED FREQUENCY OF OSCILLATION

BACKGROUND OF THE INVENTION

1. Field of the Invention

This invention relates to oscillator circuits and more particularly to low-power oscillator circuits having frequency compensated amplification stages.

2. Description Of the Relevant Art

Low-power crystal oscillator circuits typically include a quartz crystal that resonates at a certain frequency and an amplifier having a single transistor gain stage for amplifying the crystal's resonant output signal. Since the single transistor gain stage has a dominant single pole in its transfer function and since only a 90 degree maximum phase shift can occur through the single transistor gain stage due to parasitic effects, the oscillator circuit is inherently stable; that is, the oscillator will only oscillate at the natural resonant frequency of the crystal. Secondary resonant frequencies are not produced as a result of the pole in the transfer function since the loop gain of the amplifier is never equal to or greater than 0 dB when a −180 degree phase shift condition exists.

Despite the inherent stability of low-power crystal oscillators having a single transistor gain stage, this type of oscillator is difficult to fabricate for operation over a wide supply range since the gain of the amplifier depends strongly upon supply current and voltage. If the supply voltage is too low, the gain of the amplifier will not be high enough to meet the drive requirements of the output signal. To solve this problem, the oscillator circuit may be modified by utilizing additional stages of amplification to increase the gain. However, this modification results in additional poles in the amplifier transfer function that can cause the amplifier to oscillate at a secondary frequency. In other words, the utilization of additional gain stages can create a condition wherein the loop gain is greater than or equal to 0 db at a frequency when the phase shift is −180 degrees. To solve this additional problem, a circuit designer can shift the gain-bandwidth of the multi-stage amplifier by means of conventional compensation such that the possibility of the secondary oscillation frequency is eliminated. A drawback to this approach is, however, that the compensation network consumes additional power. The amount of compensation desired and the power consumed by the compensation network are often directly proportional. Therefore, the more compensation that is required, the poorer the performance of the low-power oscillator.

SUMMARY OF THE INVENTION

In accordance with the present invention, a low-power oscillator circuit is provided that includes an amplifier section having a switchable compensation network. In one embodiment, the oscillator circuit incorporates inverter amplifiers to generate a square-wave output signal that can be used, for example, as a clock signal to drive microprocessors and other digital circuitry. The invention takes advantage of the observation that, if the uncompensated bandwidth is not too excessive, compensation can be provided to the amplifier at start-up to ensure oscillation at the desired crystal frequency. Once the desired oscillation is attained, most of the oscillation cycle occurs during the non-linear regions of the inverter amplifier stages. These non-linear regions are characterized by low gain, thus suppressing any spurious oscillation. The compensation network is then removed after start-up to reduce power consumption.

These and other advantages are achieved with the present invention, in accordance with which an oscillator circuit includes a resonant network for generating a resonant signal, an amplifier section coupled to the resonant network for amplifying the resonant signal, and a compensation network coupled to the amplifier section for providing frequency compensation to the amplifier section. The oscillator circuit further includes a switching means coupled to the amplifier section and to the compensation network for selectively providing compensation to the amplifier section. In one embodiment, the amplifier section includes several inverter amplifiers to generate a digital output signal, and the switching means includes a transfer gate to provide an electrically controllable switching function.

In accordance with another aspect of the invention, a method of operating an oscillator circuit includes the steps of providing power to the oscillator circuit to generate a resonant signal, providing compensation to an amplifier section such that the gain-bandwidth of the amplifier circuit is decreased, and removing the compensation from the amplifier section after the resonant signal is amplified by the amplifier section.

The invention will be more readily understood with reference to the drawings and the detailed description. As will be appreciated by one skilled in the art, the invention is applicable to oscillator circuits in general and is not limited to the specific embodiments disclosed.

DETAILED DESCRIPTION

Figure 1:
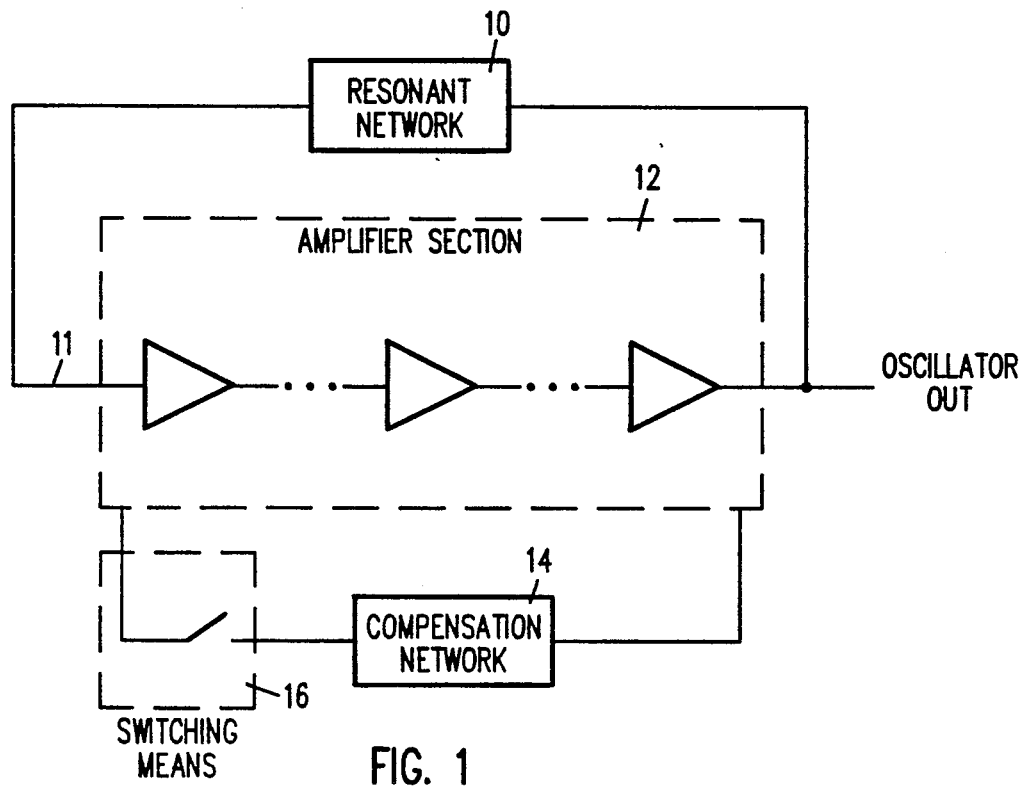
FIG. 1 is a block diagram illustrating an oscillator circuit including an amplifier with a switchable compensation network in accordance with the present invention.

Referring first to FIG. 1, a block diagram is shown that illustrates a low-power oscillator circuit in accordance with the present invention. The oscillator circuit includes a resonant network 10, an amplifier section 12, a compensation network 14, and a switching means 16. During operation, the resonant network 10 generates a resonant signal that is received at an input line 11 of amplifier section 12. The resonant network 10 may be implemented using, for example, a parallel-mode crystal oscillator circuit. The resonant signal is amplified by amplifier section 12 to thereby provide an amplified output signal at an output line labeled "OSCILLATOR OUT". The compensation network 14 is coupled to the amplifier section 12 through switching means 16 to selectively provide frequency compensation. As will be better understood from the discussion below, compensation network 14 is tailored such that the gain-bandwidth of amplifier section 12 is decreased. By properly decreasing the gain-bandwidth of amplifier section 12, a condition wherein the loop gain exceeds 0 dB at a frequency when the phase shift is −180 degrees can be eliminated.

When the oscillator circuit is initially powered on, switching means 16 is closed such that amplifier 12 is frequency compensated. The amplified output signal can thus oscillate only at the natural resonant frequency of resonant network 10. Once the desired oscillation is attained, switching means 16 is opened to remove the compensation network 14 from amplifier section 12. The oscillator thereafter continues to oscillate at the crystal resonant frequency, and no power is dissipated within compensation network 14.

Figure 2:
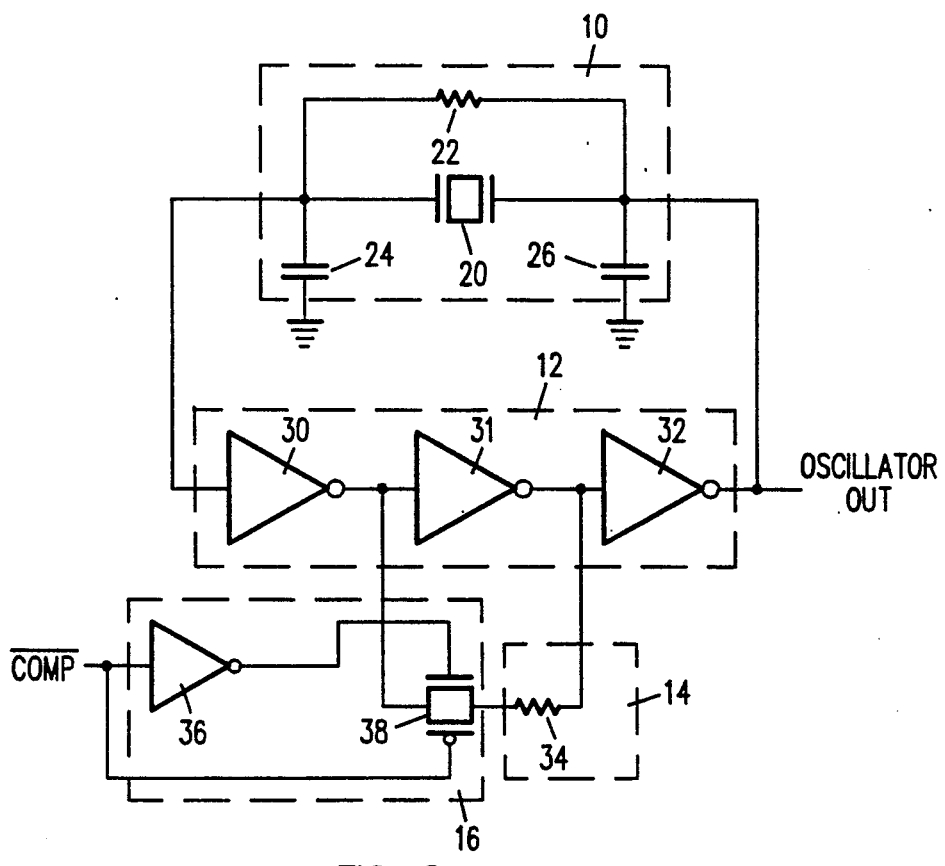
FIG. 2 is a schematic diagram illustrating an oscillator circuit incorporating inverter stages to generate a square-wave output signal.

Referring next to FIG. 2, a schematic diagram is shown that illustrates a specific implementation of an oscillator circuit in accordance with the present invention. Circuit blocks that correspond to those of FIG. 1 are numbered identically. The embodiment of FIG. 2 is an oscillator circuit that incorporates multi-staged inverter amplifiers to generate a square-wave output signal. This square-wave output signal may be used, for example, as a clock signal to drive microprocessors and other digital circuitry.

A resonant network 10 is shown that includes a crystal resonator 20, a resistor 22, and capacitors 24 and 26 connected to form a parallel-mode crystal resonator circuit. Resistor 22 and capacitors 24 and 26 are provided to bias resonant network 10. In this embodiment, crystal resonator 20 has a resonant frequency of 32 kHz.

The resonant network 10 is connected to an amplifier section 12 including multi-staged inverter 30-32. A compensation network 14 in this embodiment consists of a resistor 34 that adds zero compensation to reduce the closed-loop gain and to offset the effects of the poles of inverter amplifiers 31 and 32. A switching means 16 is formed by an inverter gate 36 and a transfer gate 38 to provide the compensation switching function.

Figure 3A:
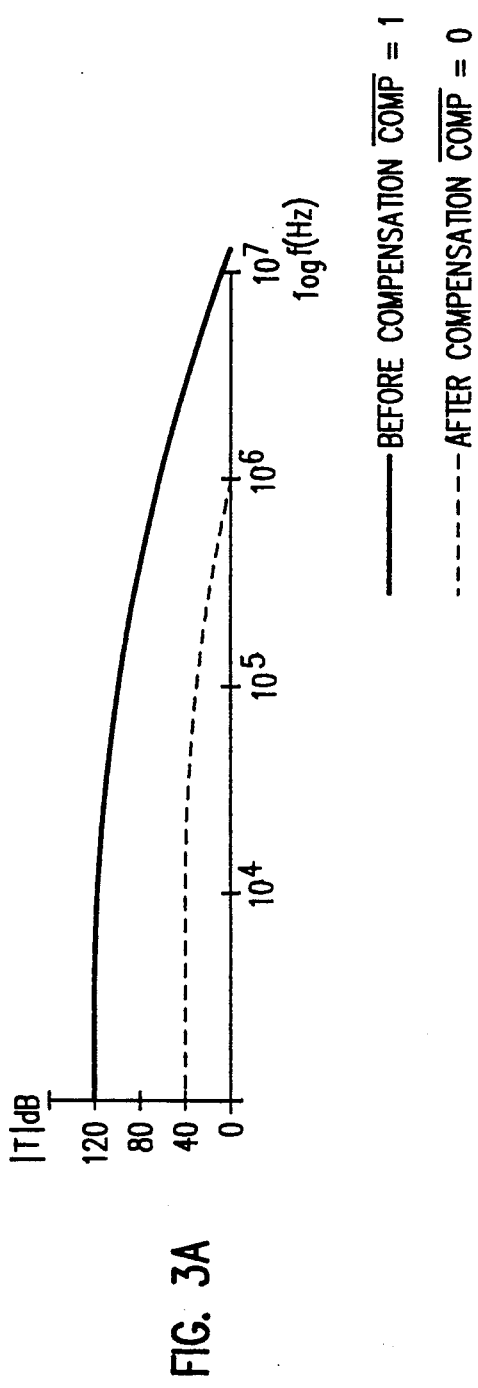
FIG. 3A is a frequency-domain diagram illustrating the effects of compensation upon the gain characteristics of an amplifier.
Figure 3B:
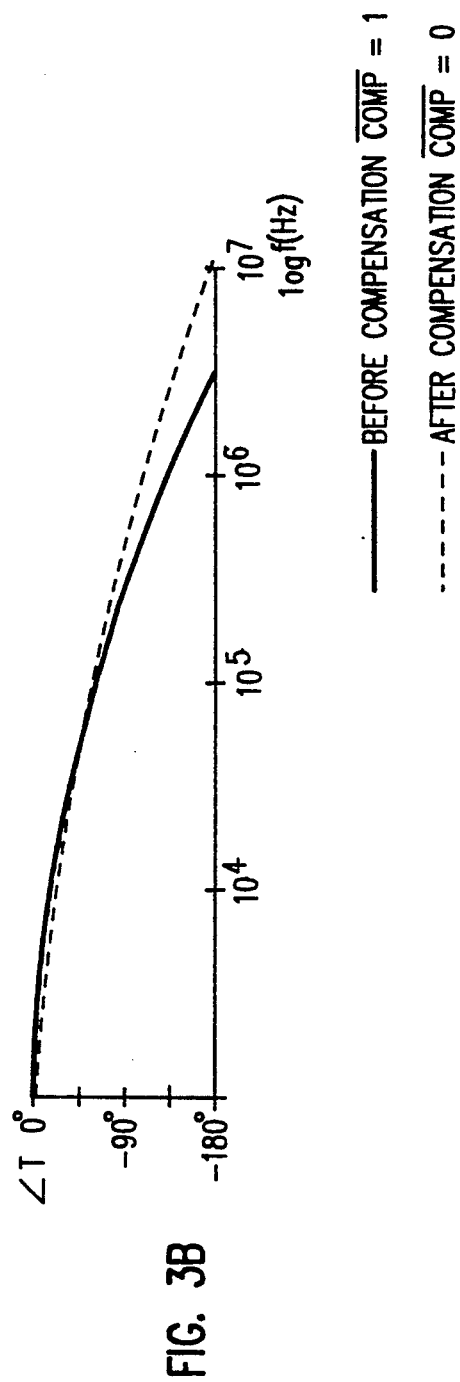
FIG. 3B is a frequency-domain diagram illustrating the effects of compensation upon the phase characteristics of an amplifier.

Referring next to FIG. 3A and 3B, frequency domain diagrams are shown that illustrate the effects of compensation network 14 upon the gain and phase characteristics of section 12. The gain and phase characteristics, respectively before compensation is applied (i.e., when transfer gate 38 is open) are represented by the solid characteristic curves of FIGS. 3A and 3B, respectively and the gain and phase characteristics after compensation is applied (i.e., when transfer gate 36 is closed) are represented by the dashed characteristic curves. A negative gain margin of approximately 50 dB is illustrated at about 3 MHz when compensation is not applied. When the 32 kHz crystal resonant network 10 is connected across amplifier section 12, crystal resonator 20 provides enough phase shift for the circuit to oscillate at 32 kHz. However, since the gain of amplifier 12 is greater than 0 dB when a phase shift of −180 degrees exists, it is possible for the circuit to sustain oscillations at two different frequencies, 32 kHz or 3 MHz. Ambient noise, circuit transients, or initial bias conditions can influence the frequency at which the circuit will oscillate, an undesirable situation for a 32 kHz oscillator.

Thus, to prevent the spurious oscillation condition, compensation is provided to amplifier section 12 by setting signal $\overline{\text{COMP}}$ low when the oscillator circuit is first powered on. As illustrated from the dashed curves of FIGS. 3A and 3B, the gain and phase characteristics, respectively are shifted when compensation is applied such that a 90 degree phase margin exists at 1 MHz. When operated under this condition, the amplifier section 12 is inherently stable and the circuit will oscillate only at the 32 kHz. Following startup of the oscillator circuit, signal $\overline{\text{COMP}}$ is set high to remove compensation resistor 34 from the circuit. This shifts the gain and phase characteristics of amplifier section 12 back to the uncompensated state as illustrated by the solid curves of FIGS. 3A and 3B, respectively. However, since most of the oscillation cycle occurs during the non-linear regions of the inverter amplifiers 30–32, spurious oscillation does not regenerate after the compensation is removed. In addition, since power is no longer dissipated by compensation network 14, overall power consumption by the oscillator circuit is reduced.

Figure 4:
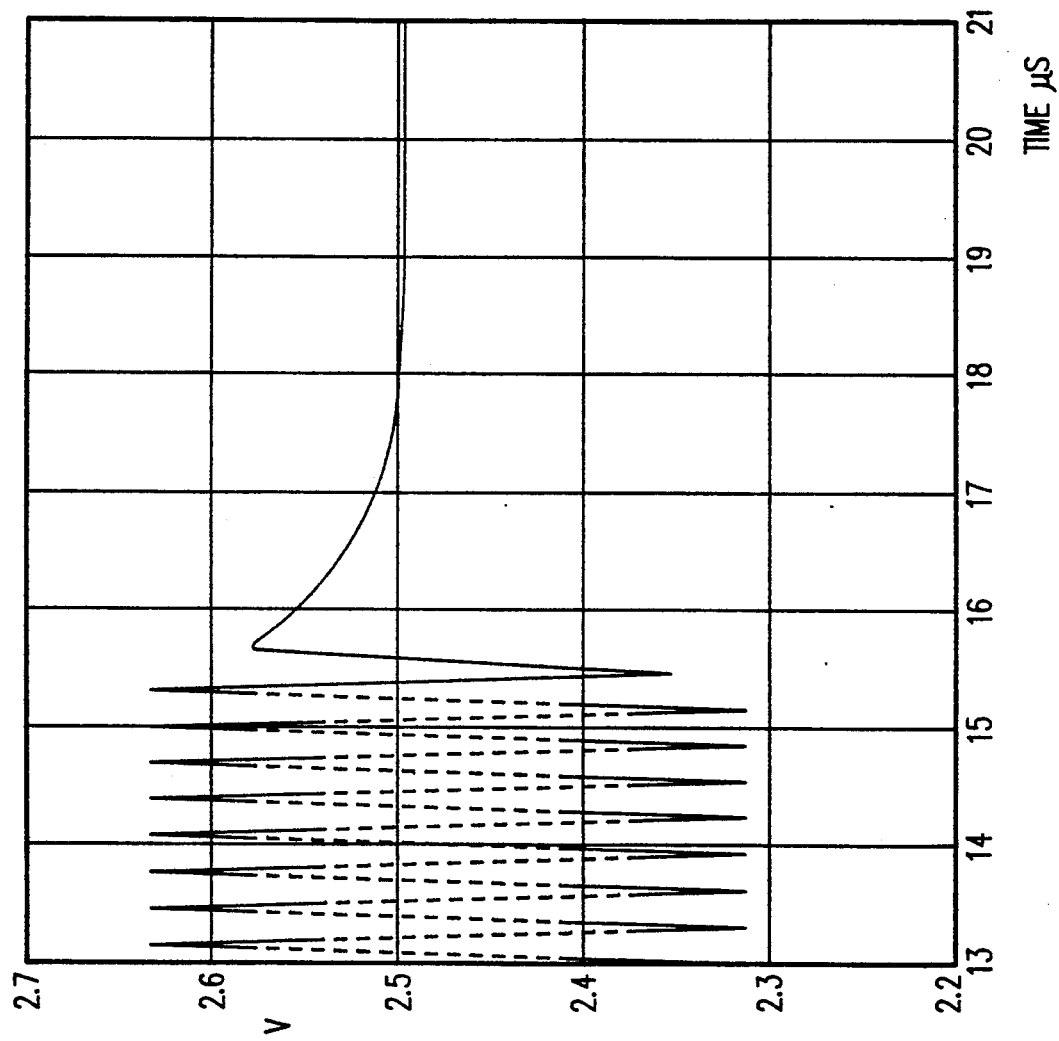
FIG. 4 is a waveform illustrating spurious oscillation suppression when compensation is applied to an amplifier.

FIG. 4 is a waveform illustrating the performance of amplifier section 12 without an external 32 kHz crystal network. Initially, compensation is not provided to amplifier section 12. As illustrated, parasitics supply enough feedback to sustain a 3 MHz oscillation. When compensation is provided at the 15 usec simulation timepoint, these spurious oscillations are suppressed.

Figure 5:
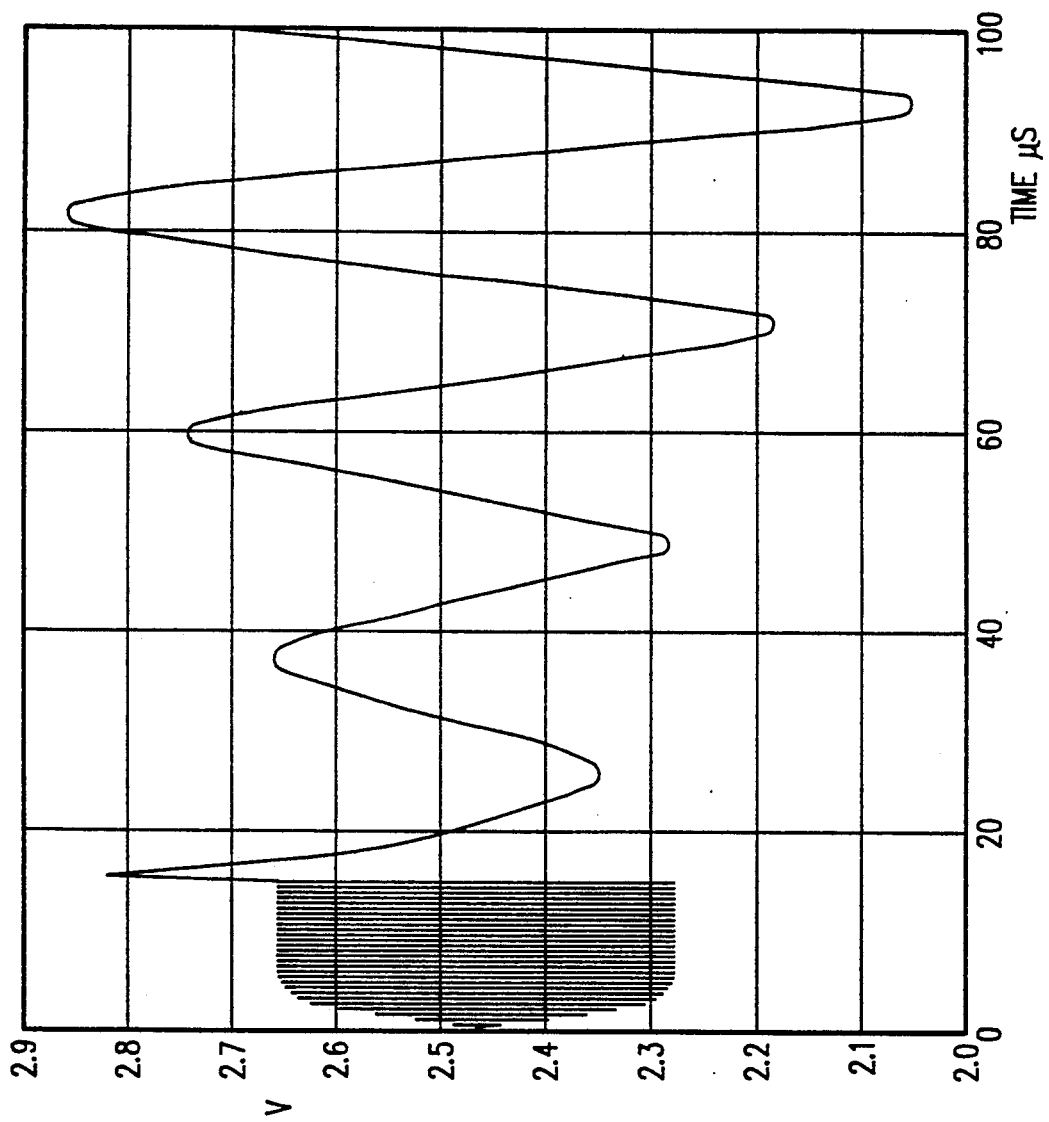
FIG. 5 is a waveform illustrating spurious oscillation suppression and generation of a desired crystal frequency signal.

FIG. 5 is a waveform that illustrates the behavior of the oscillator circuit with a 32 kHz crystal network connected. Initially, the compensation to amplifier section 12 is not enabled, and thus a 3 MHz signal is generated. At the 15 usec simulation timepoint, the 3 MHz oscillations are suppressed and 32 kHz oscillation builds. Oscillation at 32 kHz is maintained even after the compensation network 14 is removed by setting $\overline{\text{COMP}} = 1$.

Numerous modifications and variations will become apparent to those skilled in the art once the above disclosure is fully appreciated. For example, although resonant network 10 is a parallel-mode crystal oscillator circuit in the above embodiment, other resonant networks could be used, such as ceramic resonators or LC-networks. In addition, although the preferred embodiment includes an amplifier section having inverter amplifiers, the present invention could be applied to oscillator circuits incorporating other amplifier circuits that require frequency compensation. Similarly, although the switching means of the above embodiment consists of a transfer gate and an inverter gate, other switching means could be used, such as a timing relay or other similar electronic switches. It is to be understood that the above detailed description of the preferred embodiment is intended to be merely illustrative of the spirit and scope of the invention and should not be taken in a limited sense. The scope of the claimed invention is better defined with reference to the following claims.

What is claimed is:

1. An oscillator circuit comprising:
   an amplifier;
   a resonant network coupled to the amplifier for defining a transfer function and for generating a resonant signal;
   a switch; and
   a zero-contributing frequency compensation network controllably coupled to said amplifier through said switch for selectively adding a zero to said transfer function for suppressing oscillation at a frequency greater than said resonant signal.

2. The oscillator circuit as recited in claim 1 wherein said resonant network is a crystal oscillator circuit.

3. The oscillator circuit as recited in claim 1 wherein said amplifier comprises a plurality of inverters coupled in series to generate a square-wave output signal.

4. The oscillator circuit as recited in claim 1 wherein said amplifier comprises:
a first inverter;
a second inverter; and
a third inverter;
and wherein said first, second and third inverters are coupled in series to generate a square-wave output signal.

5. The oscillator circuit as recited in claim 4 wherein said compensation network includes a resistor coupled across said second inverter.

6. The oscillator circuit as recited in claim 5 wherein said switch includes a transfer gate coupled in series between said resistor and said second inverter.

7. The oscillator circuit as recited in claim 6 wherein said transfer gate is turned on when power is initially applied to said oscillator circuit and wherein said transfer gate is turned off at a time after power is applied to said oscillator circuit to remove said compensation network from said amplifier.

8. An oscillator circuit comprising:
a resonant network for generating a resonant signal;
an amplifier section coupled to said resonant network for amplifying said resonant signal, said amplifier section having an intermediate section;
a compensation network coupled across said intermediate section for suppressing oscillations at a frequency greater than the frequency of said resonant signal; and
a switch coupled to said amplifier section and to said compensation network for selectively providing compensation to said amplifier section.

9. The oscillator circuit as recited in claim 8 wherein said resonant network is a crystal oscillator circuit.

10. The oscillator circuit as recited in claim 8 wherein said amplifier section comprises a plurality of inverters coupled in series.

11. The oscillator circuit as recited in claim 8 wherein said amplifier section comprises:
a first inverter;
said intermediate section having a second inverter; and
a third inverter;
and wherein said first, second and third inverters are coupled in series.

12. The oscillator circuit as recited in claim 11 wherein said compensation network includes a resistor coupled across said second inverter.

13. The oscillator circuit as recited in claim 12 wherein said switch includes a transfer gate coupled in series between said resistor and said second inverter.

14. The oscillator circuit as recited in claim 13 wherein said transfer gate is turned on when power is initially applied to said oscillator circuit and wherein said transfer gate is turned off a predetermined time after power is applied to said oscillator circuit to remove said compensation network from said amplifier section.

15. A method for controlling an oscillator circuit, wherein said oscillator circuit includes a resonant network for generating a resonant signal, an amplifier section for amplifying said resonant signal, and a compensation network, said amplifier section having an intermediate section, the method comprising the steps of:
providing power to said oscillator circuit;
electrically coupling said compensation network across said intermediate section of said amplifier section to suppress oscillations at frequencies greater than the frequency of said resonant signal;
waiting for a time duration while amplifying said resonant signal; and
electrically disconnecting said compensation network from said amplifier section after waiting for said time duration to lapse.

16. The method as recited in claim 15 wherein said step of providing power to said oscillator circuit includes a step of providing a control signal that causes electrical coupling of said compensation network to said amplifier section.

17. The method as recited in claim 16 wherein said step of electrically disconnecting said compensation network from said amplifier section includes a step of changing said control signal from a first state to a second state.

18. A method of operating an oscillator circuit, said oscillator circuit including a resonant network for generating a resonant signal and an amplifier section for amplifying said resonant signal, said resonant network and said amplifier section defining a transfer function, said method comprising the steps of:
providing power to said oscillator circuit to generate said resonant signal;
providing compensation to said amplifier section such that a zero is added to said transfer function to suppress oscillation at a frequency greater than said resonant signal; and
removing said compensation from said amplifier section after said resonant signal is amplified by said amplifier section.

19. The method as recited in claim 18 further comprising the steps of:
amplifying said resonant signal while compensation is provided to said amplifier section; and
continuing to amplify said resonant signal after compensation is removed from said amplifier section.

20. A compensated amplifier circuit for use with an oscillator circuit including a resonant network, said compensated amplifier circuit comprising:
an amplifier section coupled to said resonant network for amplifying a resonant signal generated by said resonant network, said amplifier section having an intermediate section;
a compensation network coupled across said intermediate section for suppressing oscillations at a frequency greater than the frequency of said resonant signal; and
a switch coupled to said amplifier section and to said compensation network for selectively providing compensation to said amplifier section.

21. The compensated amplifier circuit as recited in claim 20 wherein said resonant network includes a crystal resonator.

22. The compensated amplifier circuit as recited in claim 20 wherein said amplifier section comprises:
a first inverter;
said intermediate section having a second inverter; and a third inverter;

wherein said first, second and third inverters are coupled in series to generate a square-wave output signal.

23. The compensated amplifier circuit as recited in claim 22 wherein said compensation network includes a resistor coupled across said second inverter.

24. The compensated amplifier circuit as recited in claim 23 wherein said switch includes a transfer gate coupled in series between said resistor and said second inverter, 25. The compensated amplifier circuit as recited in claim 24 wherein said transfer gate is turned on when power is initially applied to said oscillator circuit and wherein said transfer gate is turned off at a time after power is applied to said oscillator circuit to remove said compensation network from said amplifier section.

26. An oscillator as in claim 1 wherein the amplifier comprises a plurality of stages, and the frequency compensation network is coupled to a subset of the stages.

27. An oscillator as in claim 26 wherein the frequency compensation network is coupled to an intermediate subset of the stages.

28. An oscillator as in claim 27 wherein the subset of the stages consists of one stage.

* * * * *

UNITED STATES PATENT AND TRADEMARK OFFICE
CERTIFICATE OF CORRECTION

PATENT NO. : 5,331,296
DATED : July 19, 1994
INVENTOR(S) : Timothy D. Davis

It is certified that error appears in the above-indentified patent and that said Letters Patent is hereby corrected as shown below:

Column 3, line 50, after "teristics" insert --, respectively of amplifier--.

Column 3, line 51, delete ", respectively".

Signed and Sealed this

Twenty-first Day of February, 1995

Attest:

BRUCE LEHMAN

*Attesting Officer*     *Commissioner of Patents and Trademarks*